United States Patent [19]

Moriwaki

[11] Patent Number: 5,014,056
[45] Date of Patent: May 7, 1991

[54] A/D CONVERTER WITH A MAIN RANGE UP/DOWN COUNTER AND A SUBRANGE A/D CONVERTER

[75] Inventor: Ikuo Moriwaki, Kawasaki, Japan

[73] Assignee: Analog Devices KK, Tokyo, Japan

[21] Appl. No.: 346,511

[22] Filed: May 2, 1989

[30] Foreign Application Priority Data

May 11, 1988 [JP] Japan ................................. 63-114136
Nov. 24, 1988 [JP] Japan ................................. 63-297026

[51] Int. Cl.⁵ ........................ H03M 1/40; H03M 1/36; H03M 1/46
[52] U.S. Cl. .................................... 341/161; 341/159; 341/155
[58] Field of Search ............... 341/155, 156, 158, 159, 341/161, 162, 163

[56] References Cited

U.S. PATENT DOCUMENTS 4,517,550 5/1985 Nakamura ........................... 341/158
4,544,918 10/1985 De Haan ............................. 341/156

Primary Examiner—William M. Shoop, Jr.
Assistant Examiner—H. L. Williams
Attorney, Agent, or Firm—Parmelee, Bollinger & Bramblett

[57] ABSTRACT

A fast, high-resolution A/D converter circuit includes a combination of a main-range up/down counter and a subrange A/D converter. An output from the up/down counter for upper bits is D/A-converted and subtracted from an input signal, and the remainder of subtraction is A/D-converted by the subrange A/D converter, thereby obtaining high-resolution conversion data. The circuit has a feedback loop which detects that the remainder becomes less than LSB of the up/down counter and stops a count operation. By discriminating that the remainder is more/less a predetermined level set higher than the LSB of the counter or outside/inside a predetermined range, a count rate is switched between high and low rates. The remainder enters subrange via the low rate count stage.

21 Claims, 6 Drawing Sheets

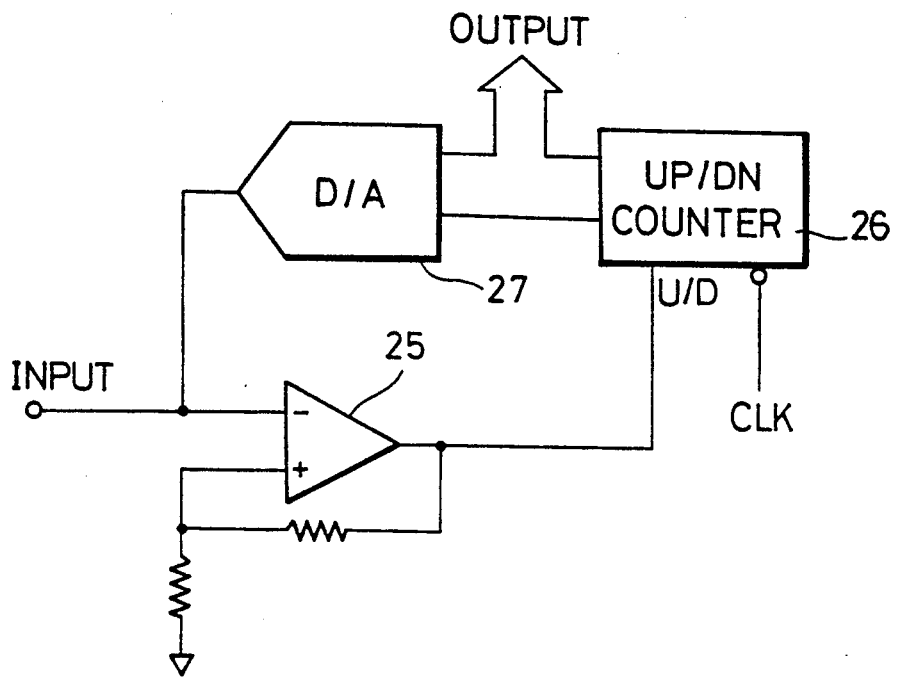
FIG. 4 _PRIOR ART_
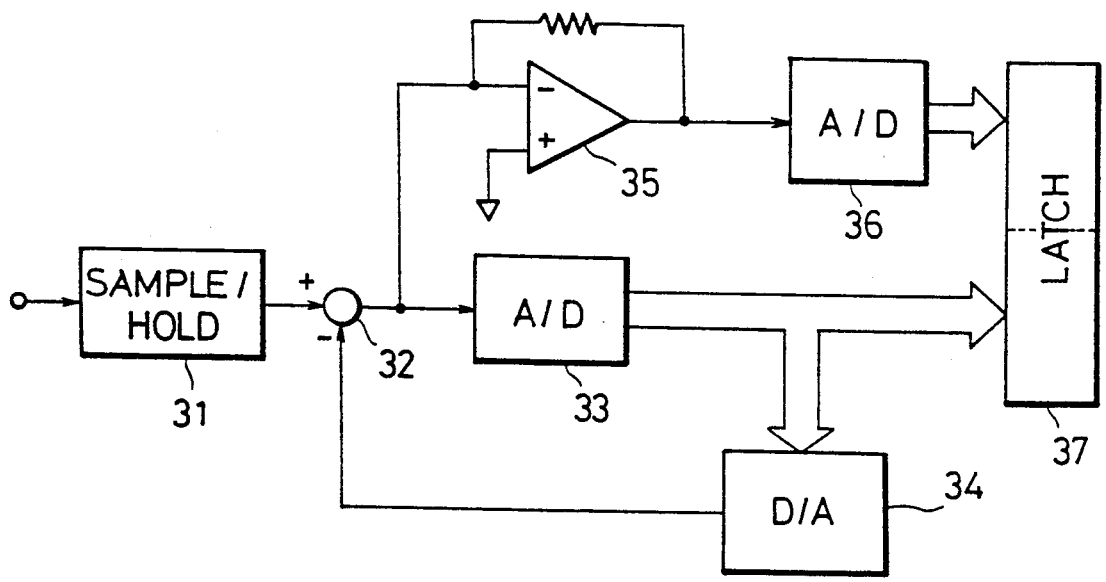
FIG. 5 _PRIOR ART_

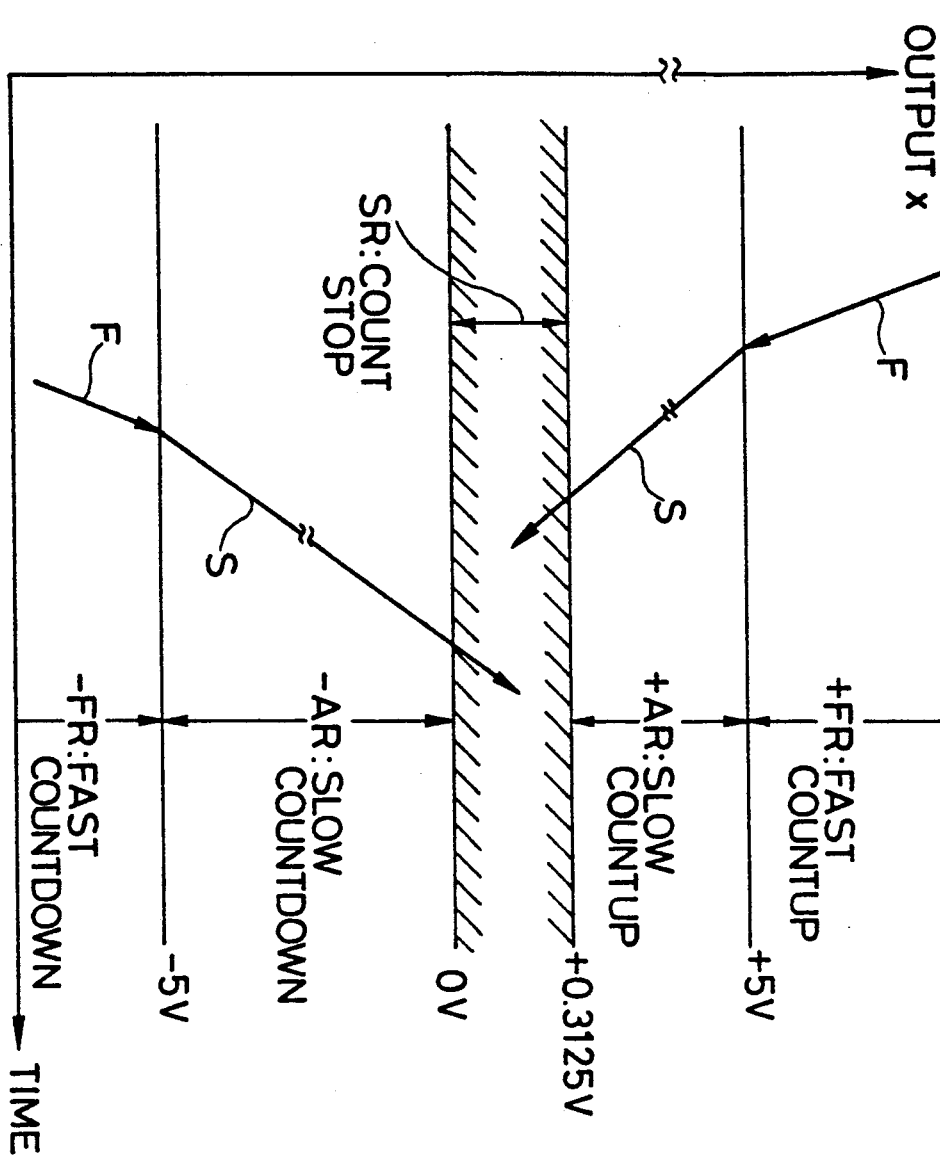

A/D CONVERTER WITH A MAIN RANGE UP/DOWN COUNTER AND A SUBRANGE A/D CONVERTER

BACKGROUND OF THE INVENTION

1. Field of the Invention

The present invention relates to a fast, high-resolution A/D converter.

2. Description of the Prior Art

A successive approximation type is often used in a middle- or high-speed A/D converter. In this system, an input voltage does not change until one conversion is finished. A sample/hold circuit is essential at an input end. An operable input frequency of the sample/hold circuit has an upper limit due to an acquisition time or signal feed through. In addition, a dynamic range of the sample/hold circuit is also limited because it is an analog circuit. A tracking type A/D converter as shown in FIG. 4 which does not require a sample/hold circuit is known.

The A/D converter shown in FIG. 4 compares an input voltage to be converted with a reference (zero) by a comparator 25 and controls a count direction of an up/down counter 26 in accordance with an output (of high level/low level) from the comparator 25. The counter 26 counts clock pulses CLK. A count output is converted into an analog signal by a D/A converter 27 and subtracted from the input. An output from the counter 26 obtained when the input voltage of the comparator 25 reaches substantially zero represents digital conversion data.

This system responds to a considerably high input frequency with respect to a small-amplitude input. The system, however, responds slowly to a large-amplitude input. In addition, since an output digital value always follows an input voltage due to count up/down, an output flutters by 1LSB. Also, resolution (a dynamic range) of the system is limited due to a problem of offset, linearity, or the like of the comparator 25 (operational amplifier). An upper limit of the resolution is about 12 bits.

A subranging A/D converter as shown in FIG. 5 is used especially in a high-resolution application. Referring to FIG. 5, an input voltage is sample-held by a sample/hold circuit 31 and supplied to, e.g., a flash A/D converter 33 via a subtractor 32. An output from the A/D converter 33 is supplied as upper bits to a latch circuit 37. Also, this output is converted into an analog voltage by a D/A converter 34 and supplied to the subtractor 32. The subtractor 32 outputs an error (difference) between the input and converted voltages. This difference is amplified with a predetermined gain by an amplifier 35 and supplied to a second A/D converter 36. An output from the A/D converter 36 is supplied as lower bits (subrange) via the latch circuit 37 together with the upper bits.

This subranging system is advantageous because a considerably high resolution is obtained by a combination of the A/D converters 33 and 36, and no error is produced due to the comparator 25 at the input side shown in FIG. 4.

In the subranging system shown in FIG. 5, since the A/D converters 33 and 36 operate sequentially, an operation speed is limited. In addition, as in the successive approximation system, the sample/hold circuit 31 is essential in this system. Therefore, the resolution of the system is substantially limited by the limitation of the dynamic range of the sample/hold circuit 31.

SUMMARY OF THE INVENTION

It is a primary object of the present invention to provide a fast, high-resolution A/D converter.

It is another object of the present invention to provide an A/D converter not requiring a sample/hold circuit or a comparator at an analog input end.

It is still another object of the present invention to prevent, when an up/down counter is used as a converting element, an LSB of a digital value as a conversion result from fluttering by up/down count.

It is still another object of the present invention to perform, when conversion is divided into a main range and a subrange, conversion in each range by automatic switching on the basis of range detection without alternately, sequentially performing conversion in the respective ranges.

It is still another object of the present invention to achieve a buffer effect so that switching from the main range to the subrange can be smoothly performed.

It is still another object of the present invention to increase a speed of conversion in the main range to improve followability with respect to a large-amplitude input, and to prevent, when conversion in the subrange is to be performed at a middle speed, a mutual interference between conversion results in the two ranges at a boundary region thereof.

It is still another object of the present invention to linearly link the main range and the subrange without processing the data.

It is still another object of the present invention to process, in subrange conversion, a bipolar conversion input by a unipolar converter.

It is still another object of the present invention to simply link, when a bipolar input signal is used, bits of the main range and the subrange without performing data correction.

An A/D converter of the present invention comprises an up/down counter for counting clock pulses to generate upper bits of conversion data, a D/A converter for converting an output from the up/down counter into an analog value, a subtractor for obtaining a remainder between an analog input signal to be converted and an output from the D/A converter, an A/D converter for converting an output from the subtractor into a digital value to generate lower bits to be linked to the upper bits, and count control means for discriminating the polarity and magnitude of the remainder obtained by the subtractor and performing count direction control and count stop control when the difference reaches a range SR for the lower bits.

According to the above arrangement, a magnitude of the remainder is discriminated. When the remainder is converged into the range of the lower bits, this is detected to stop the counter. This is carried out by loop control. The dynamic range of the remainder which is used as a sign to detect convergence is greatly reduced. The up/down counter and the subrange A/D converter are automatically switched in accordance with the magnitude of the remainder.

According to the present invention, a subranging system capable of independently generating upper and lower bits is realized. An up/down counter for generating upper bits and a subrange A/D converter are automatically switched and operated in accordance with the magnitude of the remainder. In this system, the sample/hold circuit 31, which is required for a main/subsequential operation in the conventional circuit shown in FIG. 5, need not be used. Therefore, the system has no dynamic range limitation inherent in an analog active circuit.

In addition, the comparator 25 at the analog input end of the conventional circuit shown in FIG. 4, which degrades the dynamic range of the circuit and directly processes an input signal, is not required in this system. Since the level discriminating comparator required for the loop control processes a signal having a very narrow dynamic range, the resolution of conversion is not limited by the performance of the comparator.

Furthermore, the up/down counter is stopped when the remainder is converged into the subrange. Therefore, unlike [n the conventional tracking system (FIG. 4) using the up/down counter, an LSB does not flutter. A smooth conversion output is obtained.

According to another aspect of the present invention, different count rates changing from high to low assigned to a plurality of ranges are set in accordance with a magnitude of the remainder. When the remainder is large, the count approaches the subrange at a high count rate. In the vicinity of the subrange, the count is converged into the subrange at a low speed. Therefore, fast, high-resolution conversion can be performed for a large-amplitude analog input.

A conversion value does not enter the subrange at high count rate. Even if the high count rate is set in the order of MHz, the system does not cause hunting due to a delay time or the like of a feedback loop. A damping effect can be given to a convergence operation into the subrange.

According to still another aspect of the present invention, the up/down counter and the A/D converter are operated in synchronism with each other upon slow count. Therefore, when a conversion value changes around a boundary of the convergence range, no mutual interference occurs, and a smooth operation can be achieved.

According to still another aspect of the present invention, the A/D converter generates range discrimination information required for count control in addition to subrange bits. Therefore, an arrangement of the level discriminating section for the remainder can be simplified.

According to still another aspect of the present invention, an amplifier is interposed between the subtractor and the A/D converter for adjusting a loop gain so that a change in the remainder as large as LSB of the up/down counter corresponds to a full scale change of the lower bits generated by the A/D converter.

Upper and lower bits generated by the counter and the A/D converter can be linked linearly. An output circuit may be a parallel latch circuit and is simple. A complex digital correction circuit is not required.

When a unipolar input signal is to be converted, the remainder is changed to be positive or negative by subtraction. According to still another aspect of the present invention, the up/down counter is activated from the rest state whenever the remainder becomes negative. Therefore, the subrange A/D converter need only process a positive unipolar signal. As a result, an inexpensive A/D converter can be used.

According to still another aspect of the present invention, an output from the up/down counter is considered to be of an offset binary notation, and the D/A converter generates a bipolar analog output. Therefore, a bipolar analog input signal can be processed. The subrange A/D converter receives an input signal of a bipolar remainder and generates a digital output accompanied with a sign bit. This sign bit is utilized to control the up/down direction of the up/down counter. Therefore, since the subrange A/D converter also serves as a remainder polarity discriminator, a circuit arrangement is simplified.

When the counter is controlled to perform a countup operation in correspondence with a positive sign bit of the A/D converter, convergence into the subrange is detected to determine a positive subrange output from the A/D converter. Therefore, linking of the outputs from the counter and the A/D converter as upper and lower bits, respectively, is equivalent to an additional correction which cancels the remainder to be zero as though the counter further counts up by an increment corresponding to the subrange bits. That is, the upper and lower bits need only be serially linked without performing data correction.

BRIEF DESCRIPTION OF THE DRAWINGS

FIG. 4 is a block diagram showing a conventional tracing A/D converter;

FIG. 5 is a block diagram showing a conventional subranging A/D converter;

FIGS. 7A and 7B are a graph and a code table showing a conversion range and a subrange conversion output of the embodiment shown in FIG. 6, respectively.

DETAILED DESCRIPTION OF THE PREFERRED EMBODIMENTS

Figure 1:
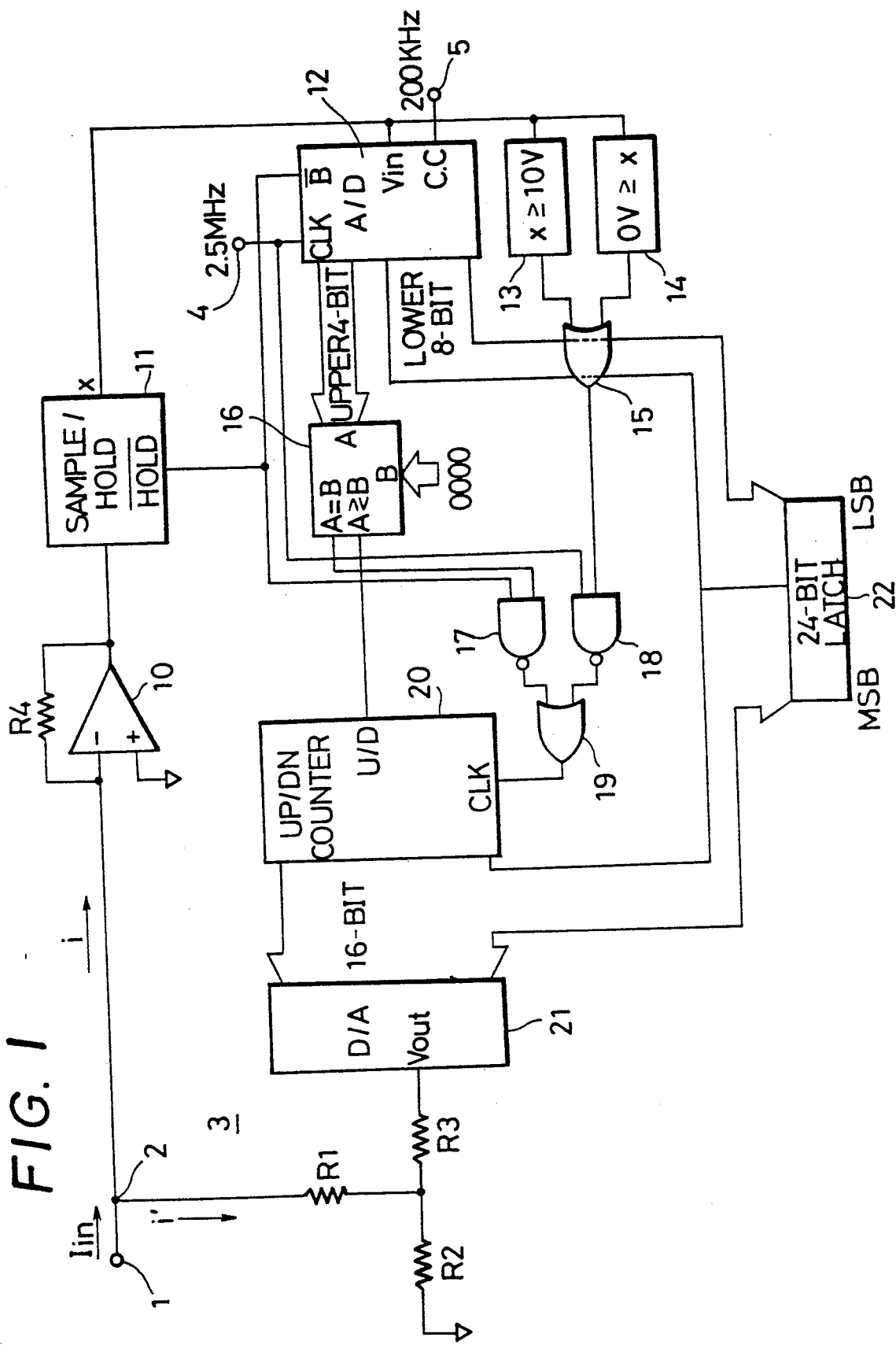
FIG. 1 is a block diagram showing an A/D converter according to an embodiment of the present invention.

FIG. 1 is a block diagram showing a 24-bit A/D converter to which the present invention is applied. An output from a D/A converter 21 is subtracted from an input signal current Iin supplied to an input terminal 1 by a subtractor 3 comprising a shunt point 2 and resistors R1 to R3. A differential remainder current i is supplied to one input terminal of an operational amplifier 10. A shunt current i' flowing from the shunt point 2 to the resistor R1 is set to be substantially equal to the input current Iin by a feedback loop (to be described later) in which the D/A converter 21 is inserted. Therefore, the remainder current i is very small. For example, when the input of the D/A converter 21 has 16 bits, the remainder is $\frac{1}{2}^{16}$ or less of a full-scale input. Assuming that an output from the D/A converter 21 supplied to one end of the resistor R3 is v, a potential at one end of the resistor R2 is zero, and a negative input of the operational amplifier 10 is at zero potential, the shunt current i' is given as follows:

$$i' = \frac{R_3 \cdot v}{R_2 R_3 + R_3 R_4 + R_2 R_4}$$

That is, a feedback path achieving i' = Iin is formed.

The operational amplifier 10 serves as an inverting amplifier of a predetermined gain having a feedback resistor R4. A positive input of the operational amplifier 10 is ground. An output from the operational amplifier 10 is supplied to an analog input terminal Vin of a lower bits A/D converter 12 and input terminals of analog comparators 13 and 14 via a sample/hold circuit 11.

Even if the dynamic range of the input signal Iin is very wide the dynamic range of the remainder current i supplied to the operational amplifier 10 is always reduced to be $\frac{1}{16}$ or less. Therefore, almost no influence is induced by the large-amplitude nonlinearity characteristics of the operational amplifier 10. Similarly, since the sample/hold circuit 11 processes a signal having a narrow dynamic range, its input/output nonlinearity error can be reduced. The sample/hold circuit 11 is necessary when the A/D converter 12 at the next stage is of a successive approximation type. If the A/D converter 12 is of a flash type, no sample/hold circuit is required.

The lower A/D converter 12 is of, e.g., a 12-bit successive approximation type. Eight lower bits of an output from the A/D converter 12 are supplied as remainder conversion data to a 24-bit latch circuit 22 at an output stage. Four upper bits of the 12 bits are converted and output with overlapping four lower bits of 16 upper bits in a 24-bit conversion output. The four upper bits from the A/D converter 12 are also supplied to a digital comparator 16. An output from the digital comparator 16 together with outputs from the analog comparators 13 and 14 are utilized as conversion control signals for an upper bits A/D converter.

The upper A/D converter comprises a 16-bit up/down counter 20. An output from the A/D converter 20 is supplied as upper-16-bit conversion data to the 24-bit latch circuit 22 and to a digital input terminal of the D/A converter 21. The D/A converter 21 generates a voltage output v to form the shunt current i' substantially equal to the input current Iin.

A control operation for the up/down counter 20 performed by the analog comparators 13 and 14 and the digital comparator 16 will be described below with reference to a graph shown in FIG. 2. If the analog comparator 13 determines that a remainder x obtained from the sample/hold circuit 11 is 10 V or more, a low-level output is supplied to a AND gate 18 via an OR gate 15, thereby enabling the gate. As a result, a 2.5-MHz clock pulse supplied to a terminal 4 is supplied from the NAND gate 18 to a clock input terminal CLK of the up/down counter 20 via an OR gate 19.

A 4-bit all-"0" signal 0000 is supplied to an input terminal B of the digital comparator 16. The digital comparator 16 compares this input B with an upper 4-bit output supplied to an input terminal A from the A/D converter 12. When the remainder x exceeds 10 V, an inequality output obtained from a terminal "A > < B" of the comparator 16 is set at high level because A > B. This high level output is supplied to an input terminal U/D of the up/down counter 20 to set the counter 20 in a countup direction.

Figure 2:
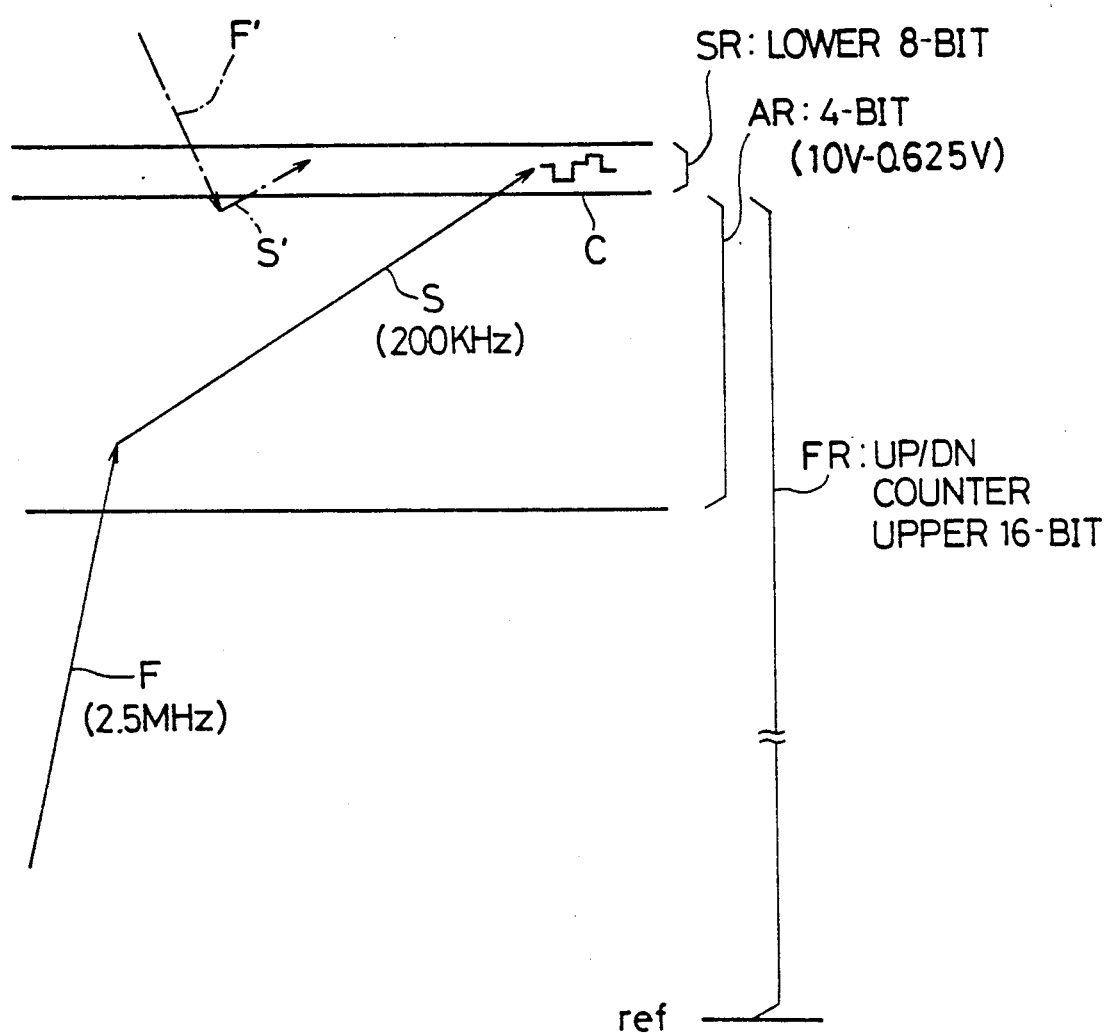
FIG. 2 is a graph showing a signal range for explaining a conversion operation.

Therefore, as indicated by a line F in FIG. 2, the count of the up/down counter 20 is increased at a very high rate of 0.4 μsec/step, and the remainder is reduced in a direction to approach an access range AR. This access range AR is a region of 10 V −0.625 V corresponding to the 4-upper-bit output from the A/D converter 12. The range AR is adjacent to a region (subrange SR) of eight lower bits of the A/D converter 12 and overlaps the four lower bits of the up/down counter 20. The gain of the operational amplifier 10 is set such that the remainder x appearing at the output becomes 10 V when all of the eight lower bits and four upper bits are "1", i.e., when the A/D converter 12 is in a full-scale state.

As described above, when the count of the counter 20 is increased, the output voltage v from the D/A converter 21 is increased, the shunt current i' flowing from the shunt point 2 is increased, and the remainder current i is reduced. The remainder enters the access range AR shown in FIG. 2 by this feedback operation. At this time, the output x from the sample/hold circuit 11 becomes 10 V or less.

When x < 10 V, the output from the analog comparator 13 is set at low level, and the gate 18 is disabled. In this state, a clock of about 200 kHz is supplied from a terminal 5 to a conversion command input terminal C.C of the A/D converter 12. A conversion operation is executed every 5 μsec. Each time the conversion is started, the A/D converter 12 outputs a low-level busy signal $\overline{B}$. The sample/hold circuit 11 is set in a hold state by the signal $\overline{B}$. The signal $\overline{B}$ is supplied to the clock input terminal of the counter 20 via a AND gate 17 and the OR gate 19. Therefore, as indicated by a line S in FIG. 2, the counter 20 is counted up at a rate of 5 μsec/-step (with an inclination about 1/12 of a line F). At this time, since the 4-upper-bit output from the A/D converter 12 is not zero, an output terminal A=B of the digital comparator 16 is at high level, and therefore the NAND gate 17 is enabled.

By countup of the up/down counter 20, the remainder enters the range SR (remainder range or subrange) of the eight lower bits of the A/D converter 12. At this time, the output terminal A = B of the digital comparator 16 is set at low level, and therefore the gate 17 is disabled. Therefore, the count of the up/down counter 20 is stopped, and the count output is latched by the latch circuit 22, thereby determining the 16 upper bits in the 24 bits.

At this time, the input current Iin and the shunt current i' coincide with each other with precision of 1LSB or less of the output from the counter 20, and the remainder current i is supplied to the operational amplifier 10. An output voltage from the operational amplifier 10 is about 0.65 V (10 V/16) or less. This output voltage is converted in the subrange SR corresponding to the eight lower bits of the A/D converter 12 at a cycle of 5 μsec and supplided as the eight lower bits of the entire 24 bits to the latch circuit 22.

As indicated by a line C in FIG. 2, when an input variation falls within the subrange SR of the eight lower bits, only the A/D converter 12 operates following the variation. When the input variation exceeds the subrange SR, the up/down counter 20 simultaneously operates, and the 12 upper bits change.

When the count of the counter 20 skips over the access range AR and the subrange SR, the shunt current i' generated by the D/A converter 21 is larger than the input current Iin. At this time, the output x from the sample/hold circuit 11 becomes negative, and this is detected by the analog comparator 14. In this case, a high-level output from the comparator 14 is supplied from the OR gate 15 to the AND gate 18, and a 2.5-MHz clock pulse is supplied to the counter 20.

The digital comparator 16 detects that the output A of the A/D converter 12 is not larger than output B (zero) thereof (A < B). The counter 20 is switched to down count by a low-level output from the comparator 16. Therefore, as indicated by a line F' in FIG. 2, the remainder obtained by subtracting the count of the counter 20 from the input enters the access range AR at a clock rate of 2.5 MHz and then into the 8-bit subrange at a conversion cycle of 200 kHz as indicated by a line S'. Note that the remainder sometimes changes along the line F' and directly goes into the subrange SR.

If the input current Iin corresponding to the LSB of the 24-bit digital conversion output obtained as described above is 10 pA, the A/D converter shown in FIG. 1 can process an input of 167 μA or less of a full scale. In this case, a dynamic range is about 150 dB. A full scale of the eight lower bits corresponds to an input of 2.56 μA, and "1" of the LSB of the up/down counter 20 corresponds to 5.12 μA at the next upper bit. Therefore, the operational amplifier 10 for amplifying the remainder has a gain capable of generating an output voltage change of 0.625 V (10/16) for an input current change corresponding to 1LSB of the counter 20. In this case, the feedback resistor R4 has a resistance of about 120 kΩ. When the input current changes by 4LSB (about 82 μA) of the counter 20, the operational amplifier 10 generates an output of 10 V.

When the full scale of the counter 20 is converted into an output voltage of the operational amplifier 10, it could under certain conditions reach a very high value. As described above, however, the output from the operational amplifier 10 is immediately suppressed to below 10 V even in a transient state by feedback servo following the input. In a stable state, the output is converged into the subrange SR of 0.625 V or less.

Figure 3:
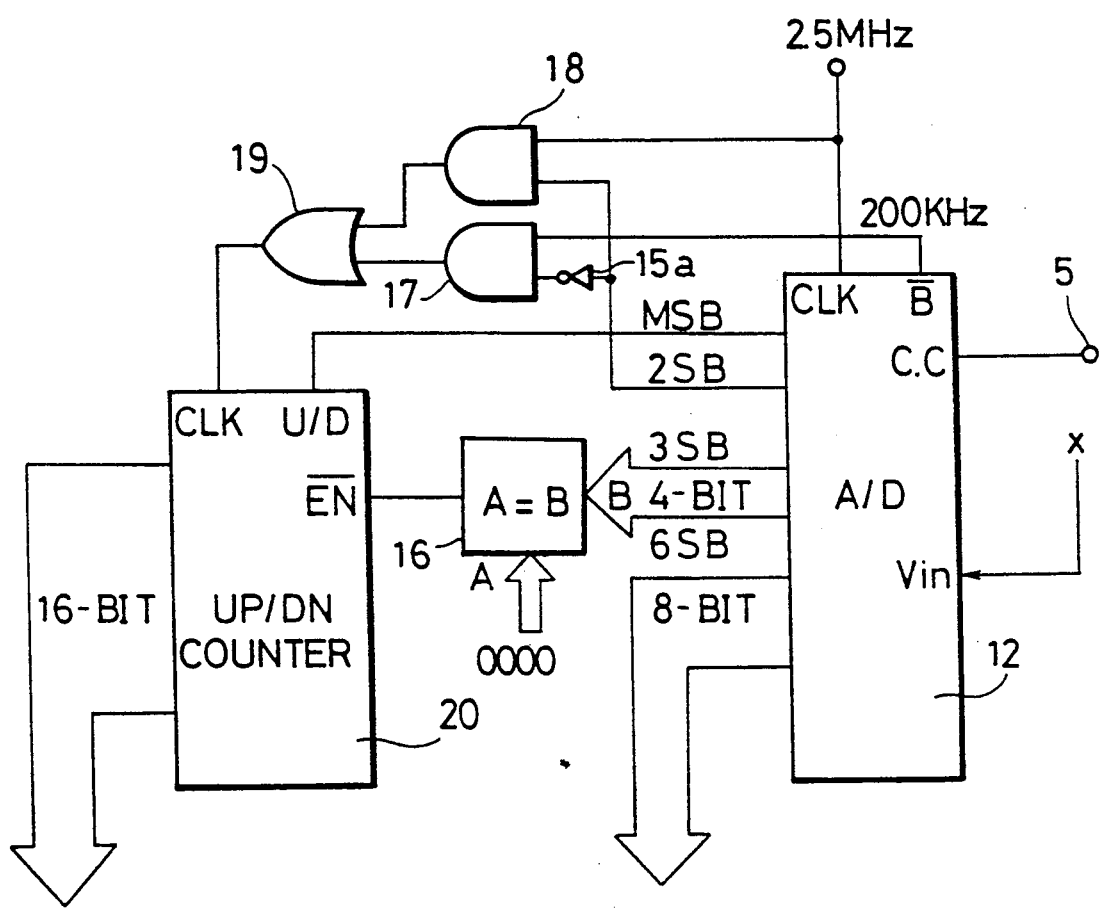
FIG. 3 is a circuit diagram showing a main part of another embodiment in which a bipolar A/D converter is used in a subrange.

In this embodiment, the A/D converter 12 shown in FIG. 1 is of a type for converting a unipolar signal. The converter 12, however, may be a type for processing a bipolar signal which changes between positive and negative values. In this case, as in another embodiment shown in FIG. 3, a 14-bit converter is used as an A/D converter 12, and its MSB output (sign bit) is used to control up/down of a counter 20. A 2SB (2nd Significant Bit) output from the 14-bit A/D converter 12 is used to switch the count rate. That is, since the 2SB goes to "1" when the remainder x is ±10 V or more, a 2.5-MHz clock is supplied to the counter 20 via an AND gate 18 and an OR gate 19. In addition, since the remainder falls within an access range AR when the 2SB goes "0", a 200-kHz busy signal $\overline{B}$ generated for each conversion operation of the A/D converter 12 is supplied from an AND gate 17 to the counter 20. The 2SB output from the A/D converter 12 is supplied to the AND gate 17 via an inverter 15a, thereby enabling the gate.

When a comparator 16 determines that four bits of 3SB to 6SB are zero (A = B), the count output is in a subrange SR. Therefore, a high-level output of A = B is supplied to an enable $\overline{EN}$ to stop the counter 20. As a result, a 16-bit output from the counter 20 is fixed, and the remainder with respect to the input is obtained from eight lower bits of the A/D converter 12.

In this embodiment of a bipolar type, the 4-bit access range AR shown in FIG. 2 is added to above and below the 8-lower-bit subrange SR, thereby realizing a complete symmetrical operation.

In the above embodiments, the input analog signal is a current. However, a voltage input can be similarly used. In this case, an input voltage to be converted and an output voltage from the D/A converter 21 are supplied to two input terminals of a differential amplifier to constitute the subtractor 3.

In each of the above embodiments, the output (main range) from the counter 20 and the output (subrange) from the A/D converter 12 linearly continue. These outputs, however, may partially overlap. In this case, a digital correction circuit for correcting an overlapped portion is used in an output section.

Figure 6:
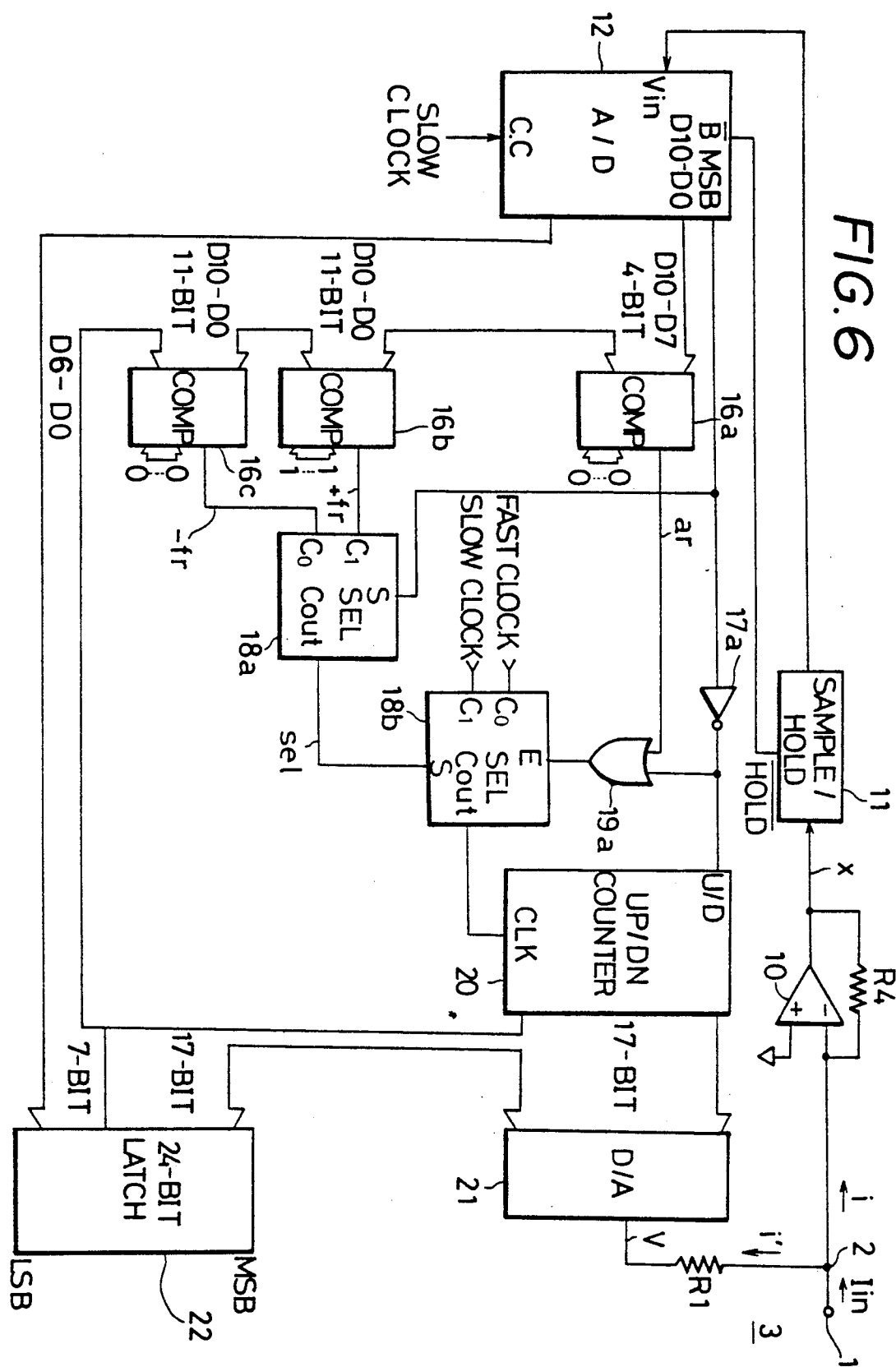
FIG. 6 is a block diagram showing still another embodiment in which a bipolar A/D converter is used in a subrange.

FIG. 6 is a block diagram showing an A/D converter according to still another embodiment of the present invention. This embodiment has the same loop as shown in FIG. 1 comprising a subtractor 3, an operational amplifier 10, a sample/hold circuit 11, an A/D converter 12, an up/down counter 20, and a D/A converter 21.

In the subtractor 3, a shunt point 2 connected to an input terminal 1 and the input terminal of the operational amplifier 10 is connected to the output terminal of the D/A converter 21 via a resistor R1. Assuming that an output from the D/A converter 21 is v, a shunt current i' is i' = v/R1.

The subrange A/D converter 12 is of, e.g., a 12-bit successive approximation type. Seven lower bits D6 to D0 of a conversion output are supplied as conversion data for a difference to a 24-bit latch circuit 22 at an output stage. Four upper bits except for the MSB in 12 bits of the conversion output are converted/output overlapping four lower bits of 17 upper bits in a 24-bit conversion output. An 11-bit output except for the MSB from the A/D converter 12 is supplied to digital comparators 16c to 16d. Control of the up/down counter 20 is performed by an output from these comparators.

An output from the 17-bit up/down counter 20 is supplied as 17-upper-bit conversion data to the 24-bit latch circuit 22 and to a digital input terminal of the D/A converter 21. The MSB of the 17 upper bits is a sign bit. In order to form the shunt current i' substantially equal to the input current Iin, the D/A converter 21 generates a voltage output v.

The D/A converter 21 is of a type for generating a bipolar output, and an all-"0" output of the up/down counter 20 corresponds to a negative full scale of the D/A converter 21. Therefore, an output from the counter 20 can be considered as an offset binary notation. The lower A/D converter 12 generates an offset binary output corresponding to a negative/positive input of the remainder. Therefore, a 24-bit output from the latch circuit 22 is offset binary. A bipolar signal can be processed as an input signal Iin to be converted.

A control operation for the up/down counter 0 performed by the digital comparators 16a to 16c will be described below with reference to a graph and a table shown in FIGS. 7A and 7B, respectively. The graph in FIG. 7A represents a voltage output x from the operational amplifier 10, and the code table in FIG. 7B represents a 12-bit output (MSB and D10 to D0) from the A/D converter 12 which receives a voltage corresponding to the output x.

Since the operational amplifier 10 is an inverting amplifier, the remainder current i (differential current) is in a negative direction and the input current Iin flows from the terminal 1 when the output x (remainder) is positive. In this case, the output x from the D/A converter 21 is increased in order to reduce the shunt current i'. That is, the counter 20 is set in a countup state.

On the contrary, when the output x from the operational amplifier 10 is negative, the remainder current i is positive, and a signal current Iin flows from the terminal 1. In this case, the output x from the D/A converter 21 is reduced in a direction to increase the shunt current i'. That is, the counter 20 is set in a countdown state.

Therefore, an MSB output from the A/D converter 12 is supplied to an up/down control terminal U/D of the counter 20 via an inverter 17a. As a result, countup is performed when the MSB is "1", and countdown is performed when the MSB is "0".

The comparators 16a to 16c detect a boundary voltage ±5 V of access ranges ±AR and a boundary voltage ±0.3125 V of a subrange SR shown in FIG. 7A on the basis of 11-bit outputs D10 to D0 from the A/D converter 12. In the access ranges ±AR, the counter 20 counts up or down a slow clock of 200 kHz so that the remainder x is converged into the subrange SR. In the subrange SR (count stop region), a count operation of the counter 20 is stopped. At this time, seven lower bits of the A/D converter 12 corresponding to the remainder x are latched as a subrange conversion output by the latch circuit 22. At the same time, an output from the counter 20 is latched as a main range conversion output (17 upper bits) by the latch circuit 22.

Each of regions outside the access ranges ±AR is a fast range ±FR in which the output x (remainder) from the operational amplifier 10 is 5 V or more or −5 V or less. In this region, the counter 20 is counted up or down by a fast clock of 2.5 MHz. Therefore, when the remainder is large, the count corresponding to the main range is increased/decreased at very high speed and enters the access ranges ±AR. The access ranges ±AR serve as buffer band in which the count rate for a fast range is reduced and convergence to the subrange SR is performed smoothly without skipping.

As shown in FIG. 7B, the boundary of the access range ±AR (±5 V and −5 V) corresponds to all "1" and all "0" of 11 bits except for the MSB of the A/D converter 12. This boundary corresponds to an uppermost and lowermost input levels for causing overflow and underflow of the A/D converter 12. This boundary is detected by the comparators 16b and 16c. The comparator 16b receives a reference value of 11-bit all-"1", and the comparator 16c receives a reference value of 11-bit all-"0". Therefore, when the output x from the operational amplifier 10 is 5 V or more, an output +fr of the comparator 16b is set at low level. When the output x is −5 V or less, an output −fr of the comparator 16d is set at low level.

The outputs +fr and −fr are supplied to data input terminals $C_1$ and $C_0$ of a data selector 18a. An MSB output from the A/D converter 12 is supplied to a select input terminal S of the selector 18a. Therefore, when S=1 (positive region), +fr is selected and output from an output terminal $C_{out}$ of the selector 18a. When S=0 (negative region), −fr is selected and output from the output terminal $C_{out}$. As shown in FIG. 7B, even in the subrange SR (count stop region), a detection output of 11-bit all-"0" may be generated from the comparator 16c. This detection output, however, is not selected by the selector 18a because MSB=1.

An output sel from the selector 18a is supplied to a select input terminal S of a data selector 18b. Fast and slow clocks are supplied to data input terminals $C_1$ and $C_0$ of the selector 18b, respectively. Therefore, since one of the output +fr or −fr from the comparator 16b or 16c is set at low level in the fast ranges +FR and −FR, the fast clock of 2.5 MHz is selected by the selector 18b.

On the contrary, in the access ranges +AR and −AR, the outputs +fr and −fr from the comparators 16b and 16c are set at high level. Therefore, the output sel from the selector 18a is set at low level, and the slow clock of 200 kHz is selected by the selector 18b.

The selected clock obtained from the output terminal $C_{out}$ of the selector 18b is supplied to a clock input terminal CK of the counter 20 to determine a high/low count rate.

As shown in FIG. 7B, the boundary (0 V and 0.3125 V) of the subrange SR corresponds to a region in which four upper bits D10 to D7 of the A/D converter 12 are all "0". This boundary is detected by the comparator 16a. A reference value of 4-bit all-"0" is supplied to the comparator 16a. Therefore, when the output x from the operational amplifier 10 is between 0.3125 V and 0 V, an output ar from the comparator 16a is set at low level.

The low-level output ar from the comparator 16a is supplied to an enable input terminal E of the selector 18b via an OR gate 19a. Note that all "0" of the bits D10 to D7 generated in the fast range -FR may be detected by the comparator 16a. At this time, however, since MSB =0, the output from the inverter 17a goes to "1", and the output from the OR gate 19a goes to "1". Therefore, the low-level output ar from the comparator 16a is not transmitted to the selector 18b.

When the low-level output ar from the comparator 16a is supplied to the enable input terminal E of the selector 18b, the selector 18b is disabled. Therefore, supply of clocks to the counter 20 is stopped. As a result, the count operation is stopped in the subrange SR.

With the above arrangement, as shown in FIG. 7A, the count of the up/down counter 20 is decreased or increased at very high rate of 0.4 μsec/step in the fast ranges +FR. The remainder x is reduced in a direction to approach the access range AR. As the count of the counter 20 changes, the output voltage v from the D/A converter 21 changes, and the shunt current i' flowing from the shunt point 2 is changed so that the absolute value of the remainder current i is reduced. By this feedback operation, the remainder enters the access range AR shown in FIG. 7A. At this time, the output x from the sample/hold circuit 11 falls within the range of ±5 V.

The gain of the operational amplifier 10 is set such that the remainder x becomes ±5 V or −5 V when the A/D converter 12 generates a positive or negative full-scale output.

When −5 V <x< ±5 V, a slow clock of 200 kHz is supplied to a conversion command input terminal CC of the A/D converter 12, and a conversion operation is performed every 5 μsec. Each time the conversion is started, the A/D converter 12 outputs a low-level busy signal $\overline{B}$. The sample/hold circuit 11 is set in a hold state by the signal $\overline{B}$. The counter 20 counts the slow clocks and is counted up or down at a rate of 5 μsec/step as shown in FIG. 7A.

When the remainder enters the subrange SR of seven lower bits of the A/D converter 12 upon count change of the up/down counter 20, the count of the up/down counter 20 is stopped. The count output from the counter 20 is latched by the latch circuit 22, and the 17 upper bits in the 24 bits are determined.

At this time, the input current Iin and the shunt current i' coincide with each other with precision of 1LSB or less of the output from the counter 20, and the remainder current i is supplied to the operational amplifier 10. The output voltage from the operational amplifier 10 is about 0.3125 V (5/16) or less and converted in the subrange SR of the seven lower bits of the A/D converter 12 at a cycle of 5 μsec. A conversion output is supplied as the seven lower bits of the entire 24 bits to the latch circuit 22.

The latch circuit 22 links the 17 bits of the up/down counter 20 and the seven lower bits of the A/D converter 12 to form a 24-bit parallel output. The output voltage from the operational amplifier 10 obtained when the. counter 20 is stopped represents an offset of a current count value of the remainder x from 0 V. Linking the output from the A/D converter 12 as lower bits to the LSB of the counter 20 virtually corresponds to counting up in sub-bits lower than the LSB of the counter 20 if it has. Therefore, the 24-bit conversion output obtained from the output terminal of the latch circuit 22 correctly represents a zero-remainder state. That is, the 17 upper bits and the seven lower bits are linearly linked without correction. No digital data correction operation is required upon linking.

When a variation of the input Iin falls within the subrange SR of the seven lower bits, only the A/D converter 12 operates to follow this variation. When the input variation exceeds the subrange SR, the up/down counter 20 simultaneously operates, and the 17 upper bits change.

What is claimed is:

1. An A/D converter circuit comprising:
   an up/down counter for counting clock pulses and generating upper bits of conversion data;
   a D/A converter for converting an output from said up/down counter into an analog value;
   a subtractor for subtracting an output of said D/A converter from an analog input signal to be converted and outputting a remainder;
   an A/D converter for converting an output from said subtractor into a digital value and generating lower bits to be linked to the upper bits; and
   a count controller for discriminating a polarity and a magnitude of a remainder obtained by said subtractor and performing count direction control and count stop when the remainder enters a range of the lower bits.

2. A circuit according to claim 1, wherein
   said count controller comprises a comparator for discriminating a magnitude of the remainder at a plurality of levels, and
   different count rates decreasing toward count stop are set in respective ranges defined by the levels.

3. A circuit according to claim 2, wherein said comparator comprises an analog comparator.

4. A circuit according to claim 2, wherein said comparator comprises a digital comparator.

5. A circuit according to claim 1, wherein
   said counter controller comprises comparators for discriminating a predetermined level located in a conversion range corresponding to the upper bits and a boundary level between the upper and lower bits, respectively, and
   a high count rate is set when the remainder is not less than the predetermined level, a low count rate is set when the remainder is between the predetermined level and the boundary level, and count stop is set when the remainder is not more than the boundary level.

6. A circuit according to claim 5, wherein the low count rate is equal to a conversion rate of said A/D converter.

7. A circuit according to claim 1, wherein said count controller discriminates an output level of said subtractor cn the basis of output data from said A/D converter.

8. A circuit according to claim 7, wherein said A/D converter generates lower bits to be linked to the upper bits generated by said up/down counter and range discriminating bits which are upper bits of the lower bits, and the range discriminating bits are supplied to said count controller.

9. A circuit according to claim 8, wherein said count controller comprises a digital comparator for comparing the range discriminating bits with zero data, and when all the range discriminating bits are zeros, a count operation is stopped in response to an output from said comparator.

10. A circuit according to claim 9, wherein up/down control of said up/down counter is performed by an inequality output (comparison output representing A>B or A<B for 2 inputs A and B) from said digital comparator.

11. A circuit according to claim 1, wherein up/down control of said counter is performed by a sign bit output from said A/D converter.

12. A circuit according to claim 11, wherein a count rate of said counter is switched between high and low rates in accordance with a level of upper bits except for a sign bit of said A/D converter.

13. A circuit according to claim 1, wherein an amplifier having a predetermined gain is inserted between said subtractor and said A/D converter so that an output change of said D/A converter corresponding to an LSB change of said up/down counter becomes equal to a full-scale input change for the lower bits generated by said A/D converter.

14. A circuit according to claim 1, wherein
    said A/D converter is of a unipolar type, and
    said count controller comprises an analog comparator for discriminating a polarity of the remainder output from said subtractor and causing said up/down counter to perform fast down count when the difference has a negative polarity.

15. An A/D converter circuit comprising:
    an up/down counter for counting clock pulses and generating upper bits of conversion data;
    a bipolar-output D/A converter for converting an output from said up/down counter into an analog value;
    a subtractor for subtracting an output of said D/A converter from an analog input signal to be converted and outputting a remainder;
    a bipolar-input A/D converter for converting an output from said subtractor into a digital value and generating lower bits to be linked to the upper bits;
    a digital comparator for comparing an output from said A/D converter with a reference value defining a boundary between the upper and lower bits; and
    a controller for controlling a count direction of said counter in response to a sign bit output from said A/D converter and stopping the count in response to an output from said comparator when the remainder is inside the boundary.

16. A circuit according to claim 15, wherein said A/D converter is of a type generating an offset binary output or a 2's complement output, an offset being given such that a maximum output of a negative polarity from said D/A converter corresponds to a count zero of said counter.

17. A circuit according to claim 16, wherein said A/D converter generates lower bits to be linked to the upper bits generated by said up/down counter and range discriminating bits as upper bits of the lower bits, the range discriminating bits being supplied to said comparator.

18. A circuit according to claim 15, further comprising:
- a second comparator for detecting at least a pair of predetermined ranges set at both sides of a stop region of said counter on the basis of an output from said A/D converter; and
- a count rate selector for switching a count rate of said counter between low and high rates inside and outside the predetermined ranges set at both sides of the stop region in response to an output from said second comparator.

19. A circuit according to claim 18, wherein the low count rate is equal to a conversion rate of said A/D converter.

20. A circuit according to claim 18, wherein said second comparator comprises a pair of comparators for detecting all-bit-"1" and all-bit-"0" of said A/D converter.

21. A circuit according to claim 15, wherein an amplifier having a predetermined gain is inserted between said subtractor and said A/D converter such that an output change of said D/A converter corresponding to an LSB change of said up/down counter becomes equal to an input change corresponding to a full scale of the lower bits of said A/D converter.

* * * * *